United States Patent
Dannoux et al.

(10) Patent No.: US 9,237,660 B2
(45) Date of Patent: Jan. 12, 2016

(54) 3-D GLASS ENCLOSURES FOR ELECTRONIC DEVICES

(71) Applicant: Corning Incorporated, Corning, NY (US)

(72) Inventors: Thierry Luc Alain Dannoux, Avon (FR); David Lathrop Morse, Corning, NY (US)

(73) Assignee: Corning Incorporated, Corning, NY (US)

( * ) Notice: Subject to any disclaimer, the term of this patent is extended or adjusted under 35 U.S.C. 154(b) by 255 days.

(21) Appl. No.: 13/677,526

(22) Filed: Nov. 15, 2012

(65) Prior Publication Data

US 2013/0128433 A1    May 23, 2013

Related U.S. Application Data

(60) Provisional application No. 61/562,622, filed on Nov. 22, 2011.

(51) Int. Cl.
| | |
|---|---|
| *H05K 5/00* | (2006.01) |
| *G06F 1/16* | (2006.01) |
| *C03C 21/00* | (2006.01) |
| *C03C 27/10* | (2006.01) |

(52) U.S. Cl.
CPC ............... *H05K 5/00* (2013.01); *C03C 21/002* (2013.01); *C03C 27/10* (2013.01); *G06F 1/16* (2013.01); *G06F 1/1656* (2013.01)

(58) Field of Classification Search
CPC ........... H05K 5/00; G06F 1/16; G06F 1/1656; C03C 21/002; C03C 27/10
See application file for complete search history.

(56) References Cited

U.S. PATENT DOCUMENTS

| | | | |
|---|---|---|---|
| 2012/0069517 A1* | 3/2012 | Prest et al. | 361/679.56 |
| 2013/0258569 A1* | 10/2013 | Amin et al. | 361/679.01 |

* cited by examiner

*Primary Examiner* — Michael C Miggins
(74) *Attorney, Agent, or Firm* — John T. Haran

(57) ABSTRACT

A 3-D glass enclosure comprises a generally planar glass base member, an encircling glass side wall member connected to the base member, and a generally planar glass cover member connected to the side wall member to form a unitary glass enclosure, the base, sidewall and cover members being made by reforming softened glass sheet preforms and subjecting the reformed members to ion-exchange strengthening, thus providing strong transparent enclosures for electronic devices such as tablet computers, cellphones, media players and televisions.

10 Claims, 1 Drawing Sheet

3-D GLASS ENCLOSURES FOR ELECTRONIC DEVICES

CROSS-REFERENCE TO RELATED APPLICATIONS

This application claims the benefit of priority under 35 U.S.C. §119 of U.S. Provisional Application Ser. No. 61/562,622 filed on Nov. 22, 2011, the content of which is relied upon and incorporated herein by reference in its entirety.

BACKGROUND

The products and methods of the present disclosure relate generally to glass enclosures and more particularly to enclosures and enclosure elements for consumer electronic devices such as computers, cellphones, media players, and televisions.

TECHNICAL BACKGROUND

Enclosures for consumer electronic devices are designed to meet stylistic as well as functional requirements. Key functional requirements include physical durability and environmental stability, the latter most importantly including resistance to moisture but also resistance to electrical, chemical and thermal environmental factors.

At present, meeting all of the requirements for consumer electronics enclosures involves the mating of diverse glass, metal and plastic enclosure elements. Plastic parts offer a high degree of shape flexibility and can be designed to provide adequate impact resistance for some enclosure components, but are highly susceptible to damage from abrasion. Metals offer good physical durability but are difficult to shape, are prone to scratching and denting damage, and are subject to corrosion in harsh chemical environments.

Glass imparts the essential characteristic of transparency to advanced consumer electronics devices, including the vast majority of products that increasingly incorporate video display and/or touch screen control functionality as central features. Glass offers a high level of resistance to chemical attack and scratch-related damage, and in advanced forms provides reasonable resistance to bending or impact fracture damage as well. Thus it is the preferred construction material for video display substrates, protective faceplates for video displays, and touch screen substrates for electronic device control screens.

Notwithstanding the wide range of materials available for the design and construction of enclosures for these devices, problems relating to enclosure durability and environmental stability remain. One problem is that the available materials differ widely in physical and chemical properties. Assembling device enclosures from two or more materials of differing thermal expansion, hardness, rigidity, machinability and/or bonding characteristics therefore presents an array of mating problems that lead to limits on the ability of the assemblies to retain physical and environmental integrity over reasonable service lifetimes. Thus there remains a need for improved enclosure designs of reduced complexity as well as improved durability and functional stability.

SUMMARY

The present invention provides electronic device enclosures and components for such enclosures that address many of the above-noted problems with conventional enclosures. The enclosures of the invention are formed predominantly of a single construction material, i.e., a strengthened glass, that glass combining high impact resistance with high bending strength so as to provide good mechanical durability as well as transparency and environmental durability. The enclosure designs are three-dimensional (3D), comprising glass front (or top), back (or bottom), and side enclosure members. Enclosures formed primarily of glass in accordance with the present disclosure can be designed to encase consumer electronic devices ranging in size from cellphones to televisions, and are particularly well adapted for use in the manufacture of mid-size devices such as laptop or tablet computers which are presently designed to combine high-definition display and touch screen control functionality in a single video display faceplate.

In particular embodiments, glass enclosures for electronic devices provided in accordance with the present disclosure comprise a generally planar glass base member connecting with an encircling glass side wall member to form a unitary glass container of a predetermined depth. For the purposes of the present description "generally planar" members include flat as well as slightly curved sheet structures, slightly curved meaning embodying large-radius cylindrical or spherical (three-dimensional) curvature as hereinafter more fully described. A generally planar glass cover member is permanently bonded to the encircling glass side wall member of the container to form an enclosed volume of a predetermined depth and of a size and shape selected for the enclosure of an electronic device. Access to the enclosed volume for the insertion of electronic components is provided by an opening or openings in the glass side wall member, e.g., by encircling only three of four sides in the case of a square or rectangular enclosure.

The unitary glass container defining the enclosed volume incorporates at least a first ion-exchanged surface compression layer of a first uniform depth extending over at least the exterior surface of the container, while the generally planar glass cover member incorporates a second ion-exchanged surface compression layer of a second uniform depth extending over at least the outer surface of the cover. The glass enclosure thus provided is absent major metallic and polymeric enclosing segments, i.e., segments enclosing more than one side of the enclosure. Thus the use of the latter materials is generally limited to inserts or ports providing, for example, speaker openings or plugging interfaces for electrical power or data connections.

As broadly conceived, a glass enclosure such as above described may be constructed of three or even more enclosing members. As an example, the unitary glass container may be constructed of separate base and sidewall members that are then permanently joined or connected with each other via organic adhesives or, more advantageously, a glass-to-glass seal, to form the unitary container. For best integrity, however, the invention provides enclosure embodiments comprising unitary glass containers wherein the encircling glass sidewall member and glass base member are integrally connected, i.e., wherein the glass base member is "integral with" the glass sidewall member, there being no joint or seal between those members. In those embodiments the sidewall portions of the container will merge seamlessly into the glass base portion thereof along angled or curved edges, as can be achieved, for example, by forming the unitary container from a single glass preform.

In another aspect the invention provides an electronic device comprising electronic components contained within an enclosure constructed of strengthened glass base, sidewall and cover members as above described, and wherein the electronic components include a video display. In particular embodiments of the device, an external surface of at least one of the base, sidewall, and cover members supports an external touch screen for controlling one or more functions of the electronic components.

In still another aspect the present invention includes a method for making a strengthened glass electronic device enclosure. In accordance with that method, a first softened glass preform, typically a section of softened glass sheet, is formed into a unitary glass container comprising a generally planar base portion and an encircling sidewall portion integral with the base portion, the sidewall portion advantageously joining the base portion at curved (rounded) edges. In particular embodiments, a softened glass sheet is formed into a unitary container comprising a quadrilateral (e.g. square or rectangular) base portion and an encircling sidewall portion integral with the base portion along three of the four edges of the quadrilateral base.

A second softened glass preform is formed into a cover member for the device enclosure, that cover member also being of a generally planar configuration and a peripheral shape approximately matching the shape of the base portion. Again, the generally planar base portion or cover may be flat or slightly curved, "slight curvature" for the purpose of the present description being limited such that the maximum separation between the surface of a slightly curved cover or base portion and a base plane defined by the edges of the cover or base portion will generally not exceed 10% of the smallest width or breadth of the cover or base.

The unitary glass container and cover member thus provided are subjected to an ion-exchange strengthening treatment, each such treatment comprising exposing the glass part to a source of exchangeable alkali metal ions for a time and at a temperature sufficient to develop strengthening surface compression layers in each of the glass parts, thus to provide a strengthened glass container and a strengthened glass cover member. The strengthened glass cover member is then attached to the sidewall portion of the strengthened unitary glass container to the form the strengthened glass enclosure. Any means for attaching the cover to the glass container that can provide a strong, stable and moisture-impermeable seal between the cover and container can be used.

BRIEF DESCRIPTION OF THE DRAWINGS

The invention is further described below with reference to the appended drawings, wherein.

DETAILED DESCRIPTION

As noted above, particular embodiments of the strengthened glass enclosures provided according to the present invention comprise base and top members of quadrilateral configuration, as well as embodiments wherein the sidewall member forms at least three sides of a quadrilateral enclosure incorporating such base and top members.

Figure 1:
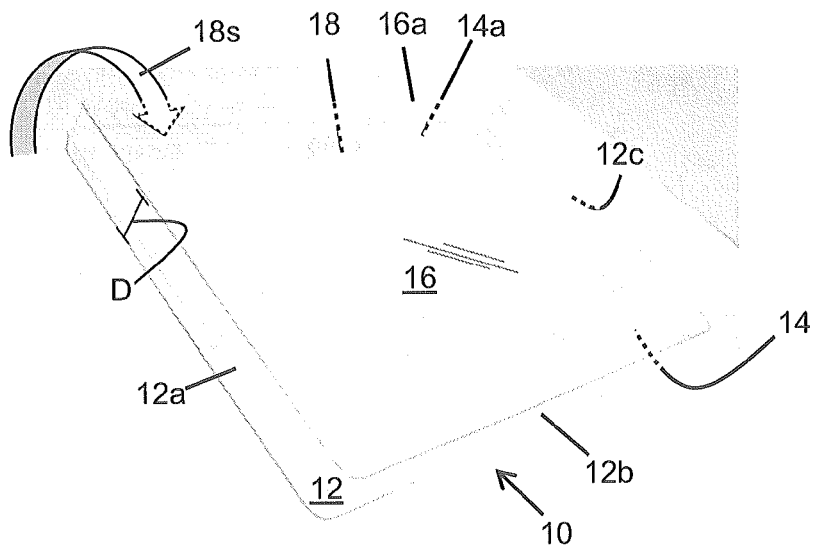
FIG. 1 is a photograph presenting a perspective view of a strengthened glass enclosure.

As illustrated in FIG. 1 of the drawings, one embodiments of a strengthened glass enclosure 10 provided in accordance with the invention may comprise an encircling (u-shaped) strengthened glass sidewall member 12 making up three sides 12a, 12b and 12c of the enclosure, that member being permanently bonded along the three sides to a quadrilateral (rectangular) strengthened glass base member 14 to form a unitary glass container. Sidewall 12 may be permanently bonded to base member 14 by means, for example, of a cured organic adhesive (e.g., a polymeric seal) or a glass frit seal, not shown, such that a unitary four-sided glass container (i.e., comprising the base and three sides) of a predetermined depth D is provided. The sidewall member and base portions 12 and 14 are subjected separately to an ion-exchange strengthening treatment prior to assembly where an organic adhesive is to be used for assembling those portions into the container.

Permanently bonded to the upper edges of sides 12a, 12b and 12c to form a strengthened glass enclosure for an electronic device is a rectangular strengthened glass cover member 16. Cover member 16 is subjected to an ion-exchange strengthening treatment prior to bonding if an organic adhesive is employed to form the permanent bond.

A useful organic adhesive for the bonding the base 14 and cover member 16 to the sidewall is a UV curable adhesive such as Vitralit® 7105 adhesive, commercially available from Panacol-Elosol GmbH, Steinbach/Taunus, Germany. If the glass enclosure is to be assembled and permanently bonded prior to ion-exchange strengthening, then a refractory inorganic bond of conventional type, such as a glass frit seal, should be used for bonding. For the purposes of the present description the base and cover members may hereinafter be interchangeably designated as top or front faces and bottom or back faces, such designations simply depending upon the device to be enclosed and the way in which the enclosed device will be oriented in use.

As further illustrated in FIG. 1, a strengthened glass enclosure produced as described may be provided with a temporary supporting member such as an internal glass or plastic supporting spacer 18. Such a spacer may suitably be of a height corresponding to the predetermined depth D of the unitary glass container, that depth suitably being in the range of 3-50 mm, and may be positioned between the base and cover members, for example proximate to the side opening 18s of the enclosure, in order to reduce bending stresses on the adjacent unattached edges 14a and 16a of base member 14 and cover member 16. Alternatively or in addition, a closing and supporting spacer, e.g., a spacer partially or totally enclosing the side opening not closed by sidewall 12, may be inserted. In some embodiments such a closing spacer may provide speaker openings or plugging interfaces for the enclosed electronic device.

The development of first and second ion-exchanged surface compression layers of a suitable thickness on the surfaces of the glass components of the strengthened glass enclosure can be secured through the use ion-exchange-strengthenable alkali aluminosilicate glasses. In particular embodiments of the disclosed enclosures, each of the first and second ion-exchanged surface compression layers have a thickness of at least 30 µm and a peak surface compression level of at least 500 MPa. These levels of surface compression enable the use of glass base, sidewall and cover members of relatively slight thickness, i.e., thicknesses in the range of 500-2000 µm.

Glasses having good forming capabilities and capable of providing surface compression layers of adequate stress and thickness via a potassium-for-sodium ion-exchange are known. Examples thereof include alkali aluminosilicate glasses comprising at least about 10% sodium oxide by weight, in some embodiments 12-15% sodium oxide by weight, and having a liquidus viscosity of at least about 1000 Kp, in some embodiments 1000-5000 Kp. Corning Code 2317 and 2318 glasses, commercially available from Corning Incorporated, Corning, N.Y., USA are examples of suitable glasses. Chemically strengthened enclosure components formed of such glasses can provide excellent transparency as well as polished surfaces of good optical quality and high resistance to chipping and scratching damage. In addition they can support surface decorations or surface coloration or texturing on inner or outer surfaces of the enclosures, such that even low-cost inner surface printing methods can provide permanent decorative features.

The herein-disclosed method for providing a strengthened glass enclosure in accordance with the invention offers particular advantages for the production of electronic device enclosures in terms of product integrity and processing efficiency. The advantages of that method result from the fact that the unitary glass container for assembling the enclosure is 3D-formed as a one-piece unit by shaping a single softened glass preform into a container comprising a generally planar base portion integrated with an encircling sidewall portion. This one-piece unit, together with a planar cover member, is then subjected to ion-exchange strengthening either before or after assembly into a completed enclosure depending upon the particular sealing method to be used.

The glass-forming method employed to form the container and cover is not critical; any of the known casting, pressing, spinning or blowing methods could in principle be used. However, in view of the slight thicknesses of the enclosure components to be used, the softened glass preforms are typically provided in the form of sections of drawn glass sheet of near-optical surface finish, and the shaping of such sheet sections is most efficiently carried out by means of sheet reforming methods such as pressing or vacuum sagging into molds of a configuration matching the desired enclosure component. The enclosures can then be assembled from the containers and cover members via conventional fastening techniques, including for example by metal clipping or permanent adhesive tape. It is generally desirable to avoid glass-to-glass contact between the containers and covers, and so thin, invisible polymer interfaces can be used permanent frit sealing methods are not practicable.

For device applications where high mechanical stresses or shock are expected, enclosure designs providing enhanced stiffness are utilized. As one approach for stiffness enhancement, the U-shaped sidewall member providing sides $12a$, $12b$ and $12c$ of FIG. 1 of the drawings comprises sidewall corners that are smoothly curved into one another, thus exhibiting lower corner stresses under applied strains than those with sharply angled corners. Additional strengthening can be conveniently provided in accordance with the above method for one-piece container forming by using a mold or other shaping means to form a container shape wherein the encircling glass sidewall portion merges into the glass base portion along curved edges as above described. Curved edges having curvature radii in the range of 2-20 mm are suitable for that purpose.

Yet another design choice offering additional enclosure stiffening is that of adding slight curvature to components of the enclosure. In particular embodiments, strengthened glass enclosures are provided wherein at least one of the glass base member or base portion and the glass cover member exhibits slight convex or concave curvature as above defined.

Figure 2:
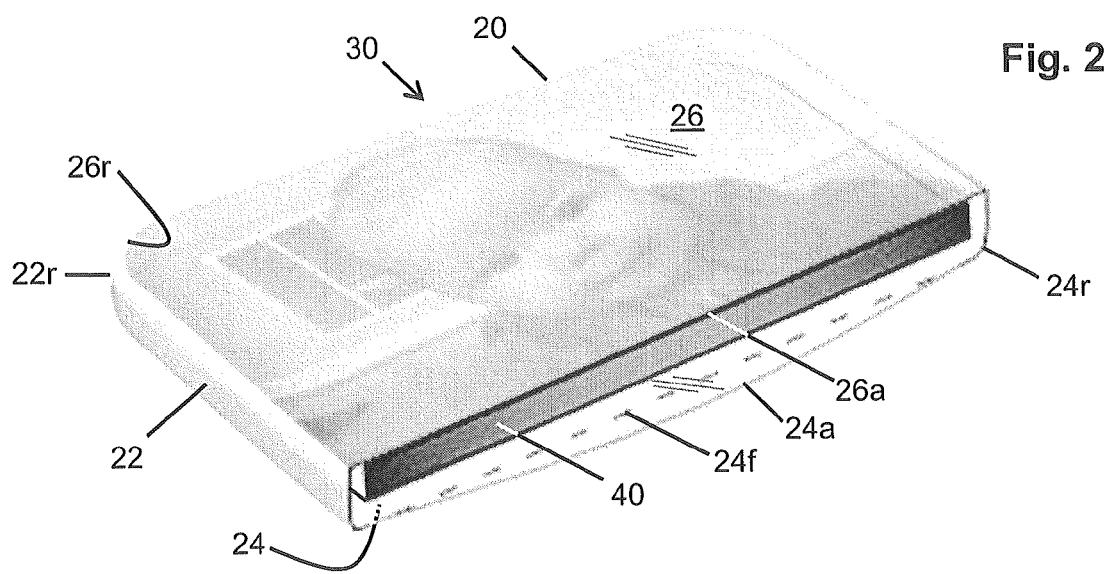
FIG. 2 is an illustration of an electronic device comprising a strengthened glass enclosure provided in accordance with an embodiment of the invention.

FIG. 2 of the drawings presents a perspective view, not in true proportion or to scale, of an electronic device employing an enclosure design incorporating curved enclosure components for added strength as described. In the drawing of FIG. 2, an electronic device 30 comprises a strengthened glass enclosure 20 incorporating an encircling sidewall member 22 having rounded corners $22r$ to reduce sidewall corner stresses as above disclosed. Rounded corners $22r$ are curved to match rounded corners $26r$ of cover member 26 which is bonded to sidewall member 22. Also to enhance enclosure rigidity, base portion 24 of enclosure 20 merges into and is integral with sidewall portion 22 along rounded edges $24r$, and base portion 24 is provided with a slight convex (outward) curvature as indicated by the departure of base portion front edge $24a$ from an imaginary flat base line $24f$ and from cover member front edge $26a$.

The electronic device 30 of FIG. 2 incorporating glass enclosure 20 as above configured is a portable media player comprising a video display component as part of electronic circuitry 40 disposed within the enclosure. Strengthened glass cover member 26 of enclosure provides transparent protection for the display and other components of electronic circuitry 40, and also supports a transparent electronic touch screen on its external surface for controlling one or more functions of that electronic circuitry.

Strengthened glass enclosures such as provided in accordance with the invention can be produced over a wide range of sizes and shapes depending only upon the sizes and shapes of the electronic devices to be enclosed. Enclosure transparency provides an obvious advantage whenever the electronic circuitry to be enclosed includes video display components, while strength and resistance to cosmetic damage favor their use for the protection of portable electronic devices, e.g., devices wherein the enclosed electronic circuitry comprises components for a laptop or tablet computer, a telephone, a camera, or a media player. Enclosures having enclosed volumes in the range of 90-7500 $cm^3$ can easily accommodate a wide variety of such circuitry. Further, the desirable electric properties of these glasses make the enclosures well suited for the construction of devices wherein at least one of the glass base member and the glass top member supports an external touch screen for controlling the electronic circuitry.

While the invention has been described above with respect to particular examples of materials, designs and methods it will be recognized that those examples have been presented for purposes of illustration only, and that a wide variety of other embodiments may adapted to meet the needs of present or future applications within the scope of the appended claims.

What is claimed is:

1. A glass enclosure for an electronic device comprising:
 a generally planar glass base member connecting with an encircling glass side wall member to form a unitary glass container of a predetermined depth; and
 a generally planar glass cover member permanently connected to the encircling glass side wall member to form an enclosed volume of the predetermined depth; wherein:
 the unitary glass container incorporates at least a first ion-exchanged surface compression layer of a first uniform depth over at least the exterior surface of the container;
 the generally planar glass cover member incorporates a second ion-exchanged surface compression layer of a second uniform depth over at least the outer surface of the cover member; and
 the glass enclosure is absent metallic and polymeric enclosing elements.

2. A glass enclosure in accordance with claim 1 comprising at least one internal glass closing and supporting spacer bonded to at least one of the glass base member and the glass cover member.

3. A glass enclosure in accordance with claim 1 wherein the glass base member, the encircling glass side wall member, and the glass cover member are formed of alkali aluminosilicate glass of a thickness in the range of 500-2000 μm.

4. A glass enclosure in accordance with claim 1 wherein each of the first and second ion-exchanged surface compression layers has a thickness of at least 30 μm and a peak surface compression level of at least 500 MPa.

5. A glass enclosure in accordance with claim 1 wherein at least one of the glass base member and the glass cover member exhibits convex or concave curvature.

6. A glass enclosure in accordance with claim 1 wherein the predetermined depth is in the range of 3-50 mm.

7. A glass enclosure in accordance with claim 1 wherein the encircling glass sidewall member is integral with the glass base member and merges into the glass base member along curved edges.

8. A glass enclosure in accordance with claim 7 wherein the curved edges have curvature radii in the range of 2-20 mm.

9. A glass enclosure in accordance with claim 1 wherein the glass base member is of rectangular shape and wherein the encircling side wall member forms a u-shaped glass side wall extending from the edges of the glass base member.

10. A glass enclosure in accordance with claim 9 wherein the u-shaped glass sidewall comprises at least two sidewall faces connecting at a curved corner junction.

\* \* \* \* \*